United States Patent [19]

Basta et al.

[11] Patent Number: 5,407,704
[45] Date of Patent: Apr. 18, 1995

[54] CVD APPARATUS AND METHOD

[75] Inventors: William C. Basta, Montague; David C. Punola, Muskegon; Daniel L. Near, Montague; Jeffery S. Smith, Muskegon, all of Mich.

[73] Assignee: Howmet Corporation, Greenwich, Conn.

[21] Appl. No.: 112,101

[22] Filed: Aug. 26, 1993

Related U.S. Application Data

[62] Division of Ser. No. 803,340, Dec. 4, 1991, Pat. No. 5,261,963.

[51] Int. Cl.$^6$ .................................................. C23C 16/00
[52] U.S. Cl. ........................... 427/248.1; 427/250; 427/252; 427/345
[58] Field of Search ............... 427/248.1, 250, 252, 427/345

[56] References Cited

U.S. PATENT DOCUMENTS

| | | | |
|---|---|---|---|
| 3,486,927 | 12/1969 | Gauje | 117/107.2 |
| 3,976,436 | 8/1976 | Chang | 29/196.6 |
| 4,098,450 | 7/1978 | Keller et al. | 228/119 |
| 4,156,042 | 5/1979 | Hayman et al. | 427/253 |
| 4,181,161 | 1/1980 | Kraus | 141/8 |
| 4,239,819 | 12/1980 | Holzl | 427/255.2 |
| 4,389,973 | 6/1983 | Suntola et al. | 118/725 |
| 4,427,720 | 1/1984 | Gauje | 427/237 |
| 4,468,283 | 8/1984 | Ahmed | 156/642 |
| 4,525,389 | 6/1985 | Stemmler et al. | 427/255.1 |
| 4,653,428 | 3/1987 | Wilson et al. | 118/725 |
| 4,747,368 | 5/1988 | Brien et al. | 118/715 |
| 4,751,109 | 6/1988 | Sarin et al. | 427/255 |
| 4,788,082 | 11/1988 | Schmitt | 427/248.1 |
| 4,890,574 | 1/1990 | Sarin et al. | 118/719 |
| 4,933,239 | 6/1990 | Olson et al. | 428/557 |
| 5,045,348 | 9/1991 | Brierley et al. | 427/248.1 |
| 5,250,323 | 10/1993 | Miyazaki | 427/248.1 |

FOREIGN PATENT DOCUMENTS

| | | |
|---|---|---|
| 0117542 | 9/1984 | European Pat. Off. |
| 0349420 | 1/1990 | European Pat. Off. |
| 0222241 | 3/1990 | European Pat. Off. |
| 2529911 | 1/1984 | France |
| 62-56752 | 3/1987 | Japan |
| 63-152117 | 6/1988 | Japan |
| 2-170981 | 7/1990 | Japan |

OTHER PUBLICATIONS

Handbook of Plasma Processing Technology, cover page and page 10, Rossnagel, Cuomo and Westwood; copyright 1990, (no month).

"Platinum Modified Aluminides–Present Status"; Gas Turbine and Aeroengine Congress and Exposition, Jun. 11-14, 1990, Brussels, Belgium, Smith and Boone.

(List continued on next page.)

*Primary Examiner*—Janyce Bell
*Attorney, Agent, or Firm*—Edward J. Timmer

[57] ABSTRACT

Chemical vapor deposition apparatus comprises a reactor having a chamber with a coating region for coating a substrate and an exhaust region communicating with the coating region. The coating region includes an inlet for introduction of a gaseous reactant stream to pass over the substrate to react therewith to form a coating thereon and a spent gas stream. The exhaust region includes an outlet for exhausting the spent gas stream from the coating region. The substrate is supported in the coating region and heated to an elevated reaction temperature by suitable support means and heating means. A condensing assembly is disposed in the exhaust region for condensing excess, unreacted gaseous reactant from the spent gas stream before entry into the outlet. The condensing assembly includes a high surface area, apertured structure disposed in the exhaust region where the temperature of the spent gas stream is sufficiently reduced to condense excess, unreacted gaseous reactant therefrom. An enclosure is disposed around the condensing structure and configured to direct the spent gas stream from the coating region to flow through the condensing structure where the excess, unreacted gaseous reactant can condense before entering the outlet.

15 Claims, 5 Drawing Sheets

OTHER PUBLICATIONS

"Kinetics of the Formation of Nickel Aluminide Coatings on Pure Nickel by Chemical Vapour Deposition"; Thin Solid Films, 146, (1987), pp. 55–64, Sun, Lin and Hon, (no month).

"Vapor Phase Aluminizing to Protect Turbine Airfoils"; pp. 13–27, Gauje and Morbioli, (no date).

"Codeposition of Chromium and Aluminum During a Pack Process"; pp. 27–35, Marijnissen, (no date).

"A Process for Protecting Gas Turbine Blade Cooling Passages Against Degradation"; Superalloys, 1980, pp. 405–411; Restall, Gill, Hayman and Archer, (no month).

"Preparation of Hot Corrosion Resistant Aluminide Layers by CVD of Aluminium from its Subchloride"; pp. 578–592, Brennfleck, Fitzer and Kehr, (no date).

*Vapor–Plating*, "The Formation of Coatings by Vapor–Deposition Techniques"; pp. 24–26, 65–66, Powell and Campbell, 1955, (no month).

"The HF 'Fluoride-ion' Cleaning Technique for Superalloys"; Ti Coating, Inc.; pp. 1–6, 1987, (no month).

"Pack Cementation Coatings for Superalloys A Review of History, Theory, and Practice"; Gas Turbine Conference and Exhibition, May 31 to Jun. 4, 1987, Anaheim, Calif., Goward and Cannon.

"Coated Tools: Two Decades of Improving Productivity"; *Cutting Tool Engineering*; vol. 41, No. 2, Feb. 1989, Clavel.

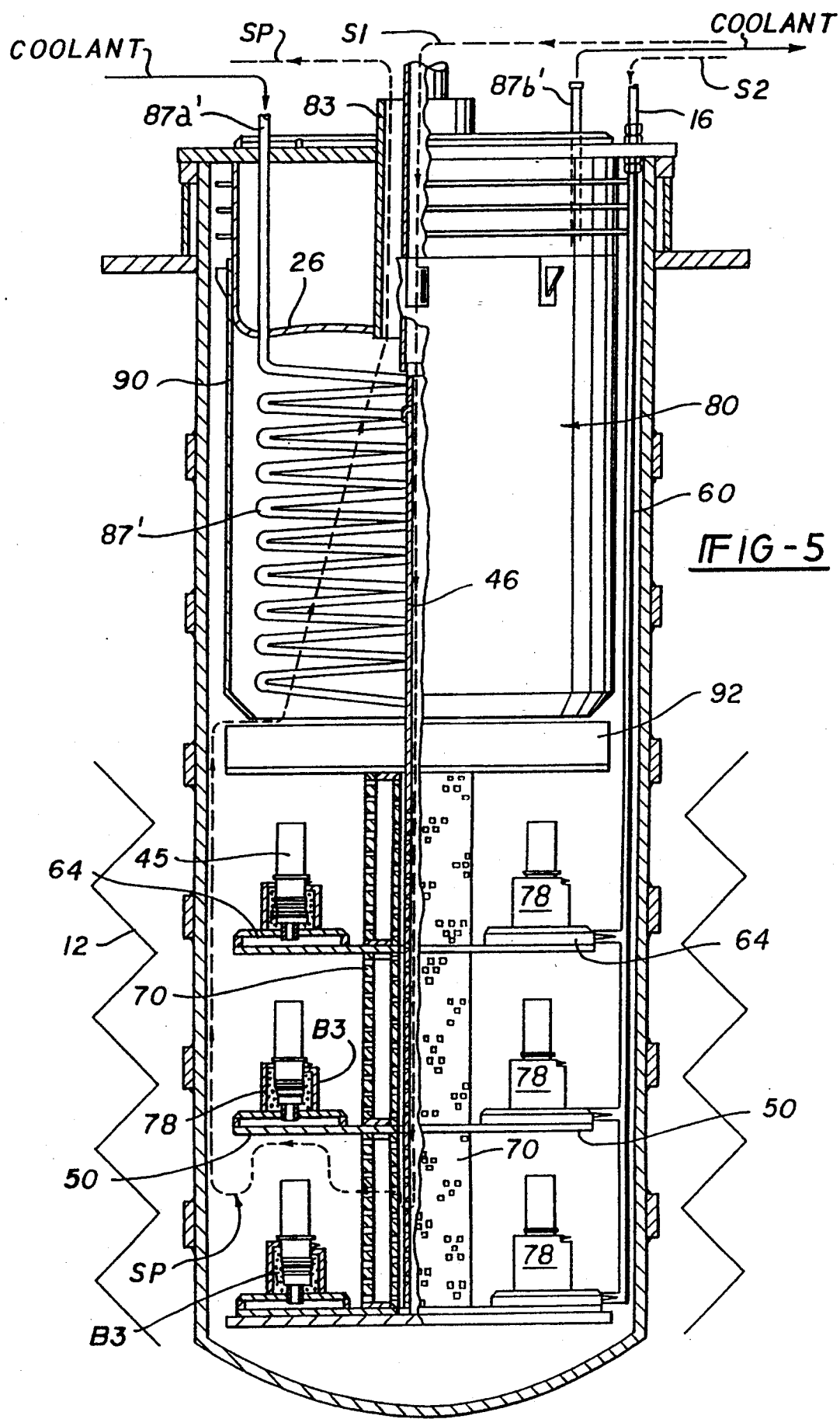

CVD APPARATUS AND METHOD

This is a division of Ser. No. 07/803,340, filed now U.S. Pat. No. 5,261,963 Dec. 4, 1991.

FIELD OF THE INVENTION

The present invention relates to a chemical vapor deposition (CVD) coating apparatus and method for protectively coating substrates and, more particularly, to a CVD coating apparatus and method wherein excess, unreacted gaseous reactant, such as a gaseous metal halide, is condensed within the reactor so as to avoid clogging of the reactor exhaust system and the condensed material is collected in a manner to avoid damage to CVD coated substrates in the reactor.

BACKGROUND OF THE INVENTION

Chemical vapor deposition (CVD) is a well known method for depositing and forming a protective coating on substrates. Typically, the substrates are loaded into a reaction furnace (reactor), heated to a suitable reaction temperature, and exposed in the reactor to one or more elevated temperature gaseous reactants that react with the substrate surfaces to deposit a coating or layer thereon. The CVD deposited coating or layer can be reacted with the substrate by suitable heating in the reactor to form a protective diffusion coating thereon; e.g., a high temperature oxidation and corrosion resistant nickel or cobalt aluminide coating on nickel or cobalt base superalloy substrates as described in the Gauje U.S. Pat. No. 3,486,927.

As illustrated in that patent, the gaseous reactant may be formed in-situ inside the reactor for reaction with the substrates. Alternately, the gaseous reactant may be formed outside the reactor in a heated reactant generator and continuously introduced into the reactor via a carrier gas, such as a reducing or inert gas, so as to pass over the substrates. After passing over the substrates, the carrier gas and any excess, unreacted gaseous reactant are exhausted from the reactor to maintain a continuous reactant flow therethrough over the substrates. In one particular CVD coating apparatus, a plurality of substrates to be coated are positioned about a gas distribution conduit network within the reactor, and the gaseous reactant, such as a metal chloride or fluoride gas in a reducing or inert carrier gas, is formed external of the reactor in a reactant generator and is metered into the reactor via the conduit network for contact with exterior surfaces of the substrates. A separate gaseous reactant generator external of the reactor and separate distribution conduit network can be provided to supply and meter the same or different gaseous reactant into the reactor for contacting interior surfaces of the substrates if they are hollow. Both external and internal coatings can thereby be concurrently formed on hollow substrates, such as hollow gas turbine engine blades, using the CVD apparatus.

Typically, the gaseous reactant is supplied to the reactor in excess of the stoichiometric amount required for coating the substrates so as to insure that CVD coatings are formed on all of the substrates to be coated. As a result, the spent reaction gases that have passed over the substrates usually contain some excess, unreacted reactant that can condense at sufficiently cool locations in the reactor exhaust conduit and eventually plug or clog the exhaust conduit.

The problem of exhaust clogging or plugging is especially severe when aluminum subchlorides (e.g., $AlCl_2$ and $AlCl$) and aluminum trifluoride and subfluorides thereof are used as the gaseous reactant and thus are present in the spent gas.

Plugging of the reactor exhaust conduit can adversely affect flow of the gaseous reactant through the reactor and even result in shut-down of the CVD apparatus in the event the exhaust conduit becomes completely plugged.

It is an object of the present invention to provide an improved CVD apparatus and method wherein the spent reaction gases are treated in a manner to condense any excess, unreacted gaseous reactant within the reactor prior to exhausting therefrom to avoid plugging or clogging of the reactor exhaust conduit.

It is another of the invention to provide an improved CVD apparatus and method system wherein the excess gaseous reactant condensed in the reactor is collected in a manner to avoid damage to CVD coated products in the reactor.

SUMMARY OF THE INVENTION

The present invention contemplates a chemical vapor deposition apparatus which comprises a reactor having a chamber with a coating region for coating a substrate and an exhaust region communicating with the coating region. The coating region includes inlet means for introduction of a gaseous reactant stream for passing over the substrate to react therewith and generate a spent gas stream. The exhaust region includes outlet means for exhausting the spent gas stream from the coating region. The substrate is supported in the coating region and heated to an elevated reaction temperature by suitable support means and heating means.

The apparatus comprises means disposed in the exhaust region preferably between the coating region and the outlet for condensing excess, unreacted gaseous reactant from the spent gas stream before entry into the outlet means. The condensing means preferably comprises an apertured condensing structure disposed in the exhaust region where the temperature of the spent gas stream is sufficiently reduced to condense the excess, unreacted gaseous reactant therefrom onto the condensing structure. The condensing structure may be passive (i.e., uncooled) or-active (i.e., internally cooled).

In one embodiment of the invention, an enclosure is disposed about the condensing structure and configured to direct the spent gas stream from the coating region to flow through the condensing structure where the excess, unreacted gaseous reactant can condense and be removed before entering the outlet. The enclosure provides a thermal barrier between the coating region and exhaust region of the chamber.

In a particular embodiment of the invention, the coating region is located in a lower portion of an upstanding reactor chamber and the exhaust region is located in an upper cooler region of the reactor chamber. The apertured condensing structure comprises a plurality of corrugated metal screens stacked atop one another in a thermal barrier tubular enclosure disposed in the upper region and configured with an opening to direct the excess, unreacted gaseous reactant through the stacked screens. The enclosure and the screens are removable from the exhaust region for cleaning of the screens to remove the excess, unreacted reactant condensed thereon. The enclosure and the screens can then be returned to the exhaust region for reuse.

The tubular, thermal barrier enclosure may comprise an upper tubular member disposed about the stacked screens and having an open lower end, and a collection member spaced beneath the tubular member so as to provide a peripheral opening therebetween through which the spent gas stream from the coating region is directed to pass through the screens from proximate the bottom toward the top of the stack. The collection member collects any condensed gaseous reactant falling from the screens to prevent damage to the underlying coated substrates. The tubular member and the collection member include respective peripheral side walls proximate a side wall of the chamber to facilitate directing the spent gas stream from the coating region into the peripheral opening.

In another particular embodiment of the invention, the apertured condensingstructure comprises an internally cooled coil structure in the aforementioned tubular enclosure in the upper region of the reactor chamber.

The present invention also contemplates a method of chemical vapor deposition wherein a substrate to be coated is supported in a coating region of a reactor chamber and is heated to an elevated reaction temperature. A gaseous reactant stream is introduced to the coating chamber to react with the heated substrate to form a coating thereon and produce a spent gas stream. Excess, unreacted gaseous reactant is condensed from the spent gas stream onto an apertured condensing structure located in an exhaust region of the reactor chamber communicating with the coating region. The temperature of the spent gas stream is sufficiently low in the exhaust region to effect condensation of excess reactant. The spent gas stream is exhausted from the exhaust region after it passes through the condensing structure.

The apparatus and method of the invention are especially useful, although not limited to, the CVD aluminizing of one or more substrates employing an aluminum halide gaseous reactant stream.

BRIEF DESCRIPTION OF THE DRAWINGS

A better understanding of the present invention will be obtained with reference to the detailed description below taken in conjunction with the following drawings in which:

FIG. 5 is a cross-sectional view of a CVD apparatus in accordance with still another embodiment of the invention with some components shown in elevation.

DESCRIPTION OF THE INVENTION

Figure 1:
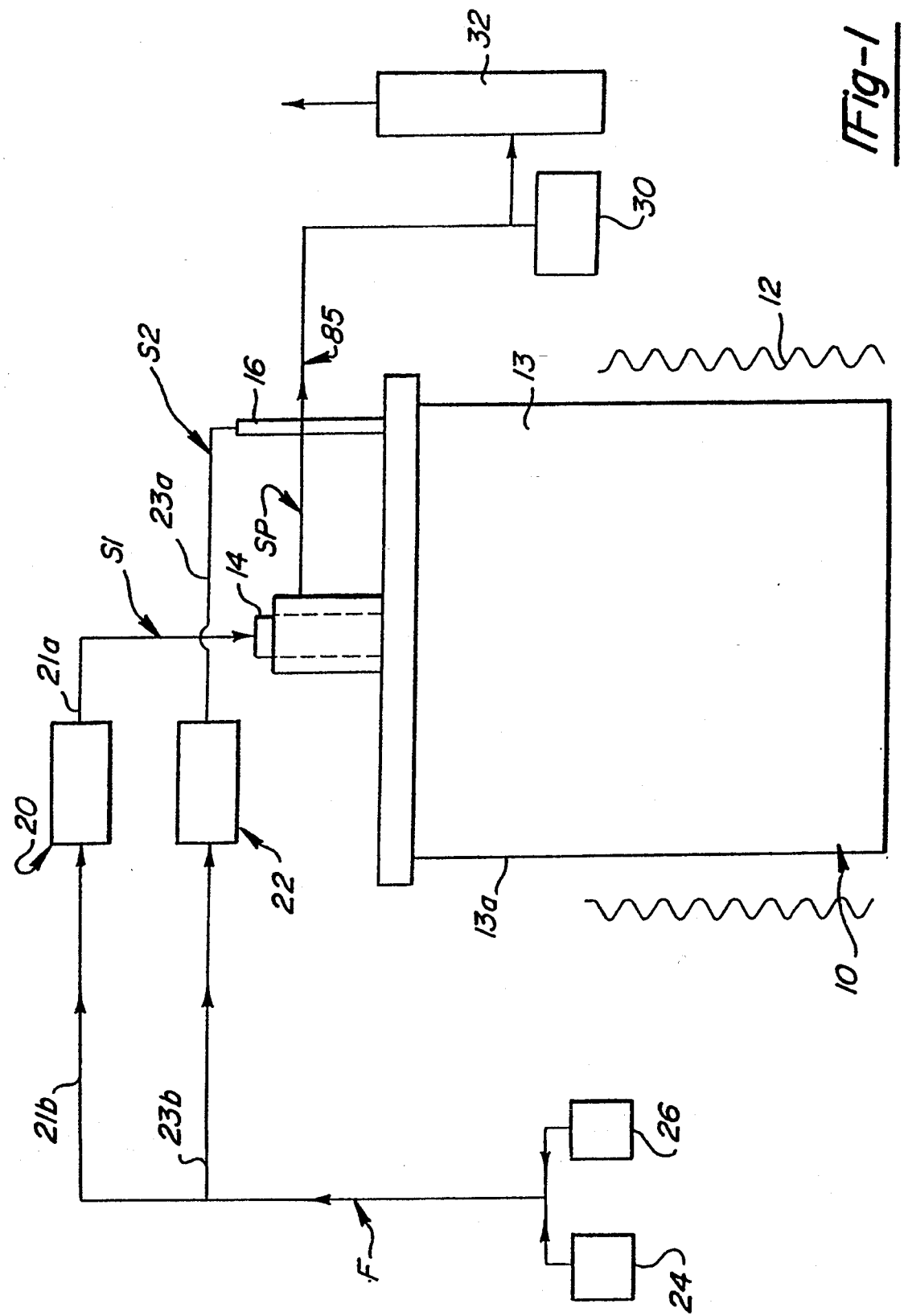
FIG. 1 is a schematic view of a CVD coating system with which the coating apparatus of the present invention can be used.

Referring to FIG. 1, a CVD coating system is schematically illustrated as including a reactor or retort 10 confronted at a lower region by a movable heating furnace 12, which may be of the electrical resistance or other known types. The reactor 10 includes a central inlet conduit 14 through which a gaseous reactant stream S1 is supplied to a coating chamber therein for external coating of hollow substrates positioned in the reactor 10 in a manner to be described below. The reactor 10 also includes an optional auxiliary inlet conduit 16 through which a gaseous reactant stream S2 is supplied for internal coating of the substrates, if desired. The substrates are heated in the reactor chamber 13 to a suitable coating temperature as a result of radiation from the heated chamber wall 13a.

In one embodiment of the invention, the central inlet conduit 14 is communicated to a conventional low temperature metal halide gas generator 20 located externally of the reactor 10 via a heated conduit 21a. The optional auxiliary inlet 16 is communicated to another conventional low temperature metal halide gas generator 22 located externally of the reactor 10 via a heated conduit 23a. The conduits 21a,23a are heated by suitable heating devices (not shown) to prevent condensation of the metal halide gas therein.

The metal halide gas generators 20,22 are typically supplied via respective conduits 21b,23b with a gas flow F comprising a mixture of an acid halide gas, such as typically HCl or HF gas, and a reducing or inert carrier gas, such as hydrogen, argon or mixtures thereof, from suitable sources 24,26. For example, the acid halide gas and the carrier gas are usually supplied from respective high pressure cylinders and blended in suitable proportions to provide the gas flow F to generators 20,22.

Exemplary low temperature metal halide gas generators 20,22 for use in practicing the invention to form an oxidation and corrosion resistant aluminide coating on nickel base superalloy substrates each comprises a bed (not shown) of aluminum pellets and a heating device (not shown) to heat the pellets to a desired reaction temperature depending upon the acid halide gas to be supplied thereto. A pellet temperature of about 300° C. is used for HCl gas while a pellet temperature of about 900° C. is used for HF gas.

The acid halide/carrier gas flow F is supplied to the generators 20,22 to flow over the pellets under conditions of temperature, pressure and flow rate to form aluminum trichloride or trifluoride gas in desired proportion to the carrier gas. The resulting aluminum halide/carrier gas mixture is supplied from each generator 20,22 as gaseous reactant streams S1,S2 to the reactor chamber 13 via the heated conduits shown.

Typically, the generators 20, 22 are selected to supply the same metal halide/carrier gas stream to the chamber 13 for aluminide coating the outer and inner surfaces of the heated substrates. However, the invention is not so limited and may be practiced using different coating gas compositions supplied from the respective generators 20,22 to the respective inlet conduits 14,16.

A suitable pump 30, such as a vacuum pump, is connected to the exhaust of the reactor chamber 13 in a manner to be described below to maintain a desired flow rate of the streams S1,S2 through the generators 20,22 and the reactor chamber 13 and to exhaust the spent coating gas stream SP from the reactor chamber 13. The spent coating gas stream is passed through a scrubber 32 before return to the ambient atmosphere. The invention is not limited to subatmospheric coating processes using the vacuum pump 30 and may be practiced in some cases at atmospheric pressure wherein the spent coating gas stream SP bypasses the pump and is fed directly to the scrubber 32.

Figure 2:
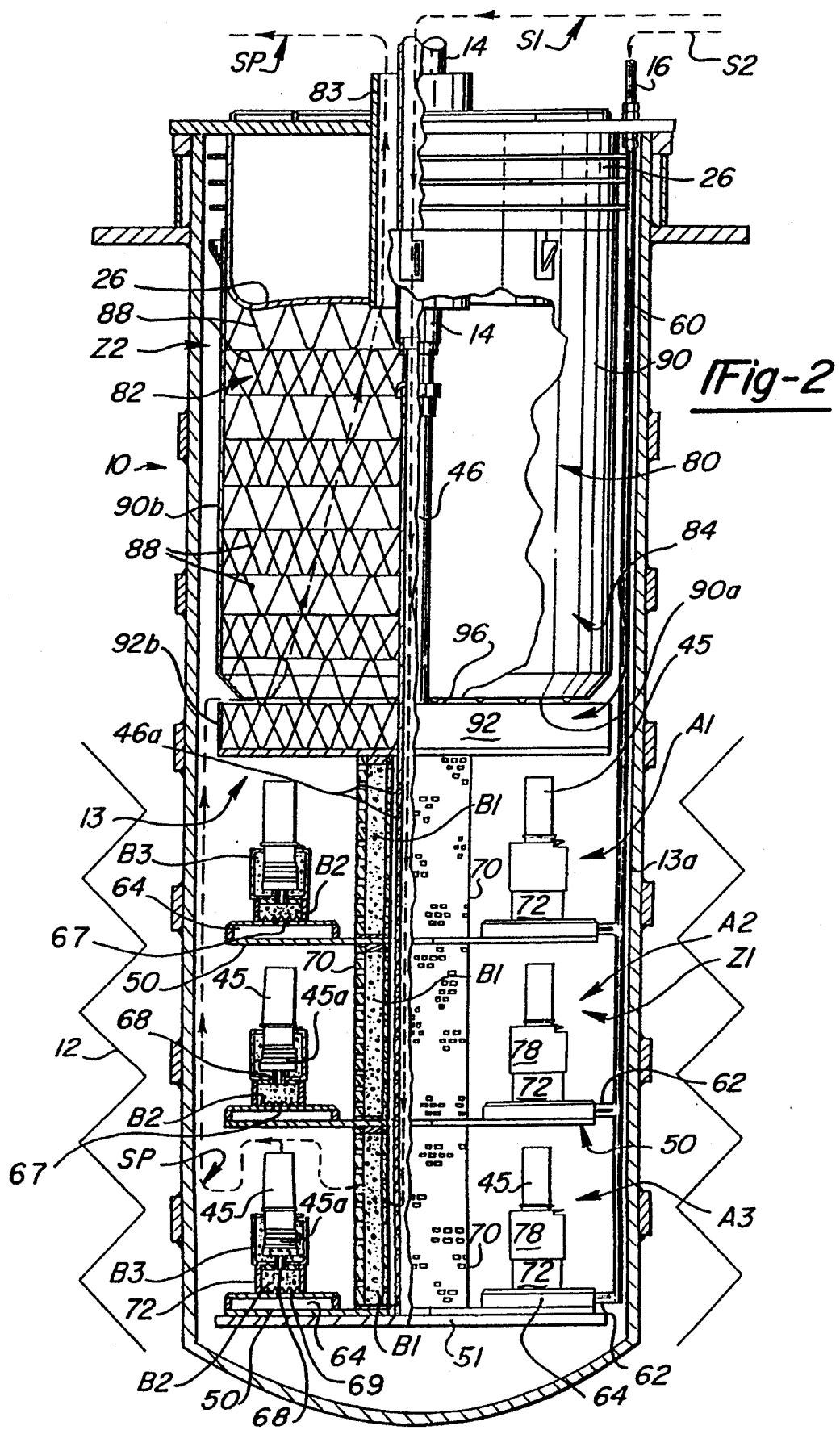
FIG. 2 is a cross-sectional view of a CVD coating apparatus in accordance with one embodiment of the invention with some components shown in elevation.

The interior of the reactor 10 is shown in FIG. 2. The reactor chamber 13 includes a lower coating region Z1 in which a plurality of substrates 45, illustrated as hollow gas turbine engine blades, are disposed on substrate supports 50 for coating on the exterior and optionally on the interior by the gaseous reactant streams S1,S2. The lowermost substrate support 50 is supported on a bottom plate 51 fastened (e.g., welded) to the elongated, central gas distribution conduit 46. The supports 50 thereabove are supported on the canisters 70 to be described below or on collars (not shown) fastened on the distribution conduit 46. Axial coating zones A1,A2,A3 are formed as a result of the axial spacing of the substrate supports 50 along the longitudinal axis of the conduit 46.

As mentioned above, the substrates 45 are heated to a desired reaction temperature by radiation from the furnace-heated chamber wall 13a.

The coating region Z1 receives the gaseous reactant stream S1 from the external generator 20 via the elongated, central gas distribution conduit 46 that extends from the heated inlet conduit 14 through a water-cooled reactor cover 26 and through the exhaust region Z2 and coating region Z1 along the longitudinal axis of the chamber 13. At the coating region, the conduit 46 is perforated to include a plurality of radially extending apertures 46a for radially discharging the stream S1. The apertures 46a thus form an inlet of the coating region Z1 for introduction of the gaseous reactant stream S1 to coating zones A1,A2,A3.

The coating region Z1 also optionally receives the gaseous reactant stream S2 from the external generator 22 via an elongated, offset distribution conduit 60 that extends from the inlet conduit 16 through the exhaust region or zone Z2 and coating region or zone Z1 along an offset axis of the chamber 13. At the coating region, the conduit 60 is connected in gas flow communication via stub pipes 62 to annular gas manifolds 64 on which the substrates 45 are positioned. As shown in FIG. 2, the manifolds 64 communicate via gas openings 67 and gas tubes 68 to the interior of the substrates 45 for supplying the stream S2 through the heated substrates 45 at the coating zones A1,A2,A3. Each gas tube 68 typically comprises a hollow, open-ended T-shaped member inserted in the open end of the lowermost substrate portion 45a, see lower, left-hand substrate 45 in FIG. 2, such that the stream enters the lower open end and exits apertures in the upper end of the T-shaped member. The spent gas stream SP exits from the interior of the hollow substrates 45 through suitable openings in the upper ends thereof as illustrated for the lower, left-hand substrate 45 in FIG. 2.

When the gaseous reactant streams S1,S2 each comprise an aluminum trichloride/carrier gas mixture, the streams S1,S2 may be discharged from the distribution conduits 46 and 60 for flow through beds B1,B2, respectively, of reactivity-altering material to convert (reduce) the aluminum trichloride to more reactive aluminum subchloride gases, such as $AlCl_2$ and $AlCl$ (a higher activity form of Al). In the context of forming exemplary CVD aluminide coatings on the nickel base superalloy substrates having typical coating thicknesses in the range of approximately 1½ mils to 3 mils, the reactivity-altering material typically comprises a bed B1 of Al—Cr alloy particulates contained in each perforated, tubular canister 70 disposed concentrically about the distribution conduit 46 as shown in FIG. 2 and a similar Al—Cr alloy particulate bed B2 supported on screen 69 in each non-perforated canister 72 communicated to the interior of the substrates via the gas tubes 68 and to manifolds 64 via gas openings 67 as also shown in FIG. 2. Each canister 70 includes inner and outer walls perforated as shown in FIG. 2 for flow of stream S1 through bed B1. Al—Cr particulates of $-\frac{1}{2}+\frac{3}{8}$ inch particle size (particle size greater than $\frac{3}{8}$ inch and less than $\frac{1}{2}$ inch) have been used in practicing the invention and are available from Reading Alloy, Reading, Pa. Use of the reactivity-altering material beds B1,B2 in the canisters 70,72 is described in more detail in commonly assigned, copending application Ser. No. 802,257 entitled "CVD Apparatus And Method For Forming Uniform Coatings", the teachings of which are incorporated herein by reference.

The subchloride gas streams S1,S2 thereby formed pass over the external and internal (optional) surfaces of the heated substrates 45 (substrates at 650° to 1200° C.) where they react with substrate surfaces to form an oxidation and corrosion resistant aluminide coating thereon of a relatively high aluminum content and of a more "inward" diffusion type.

Figure 4:
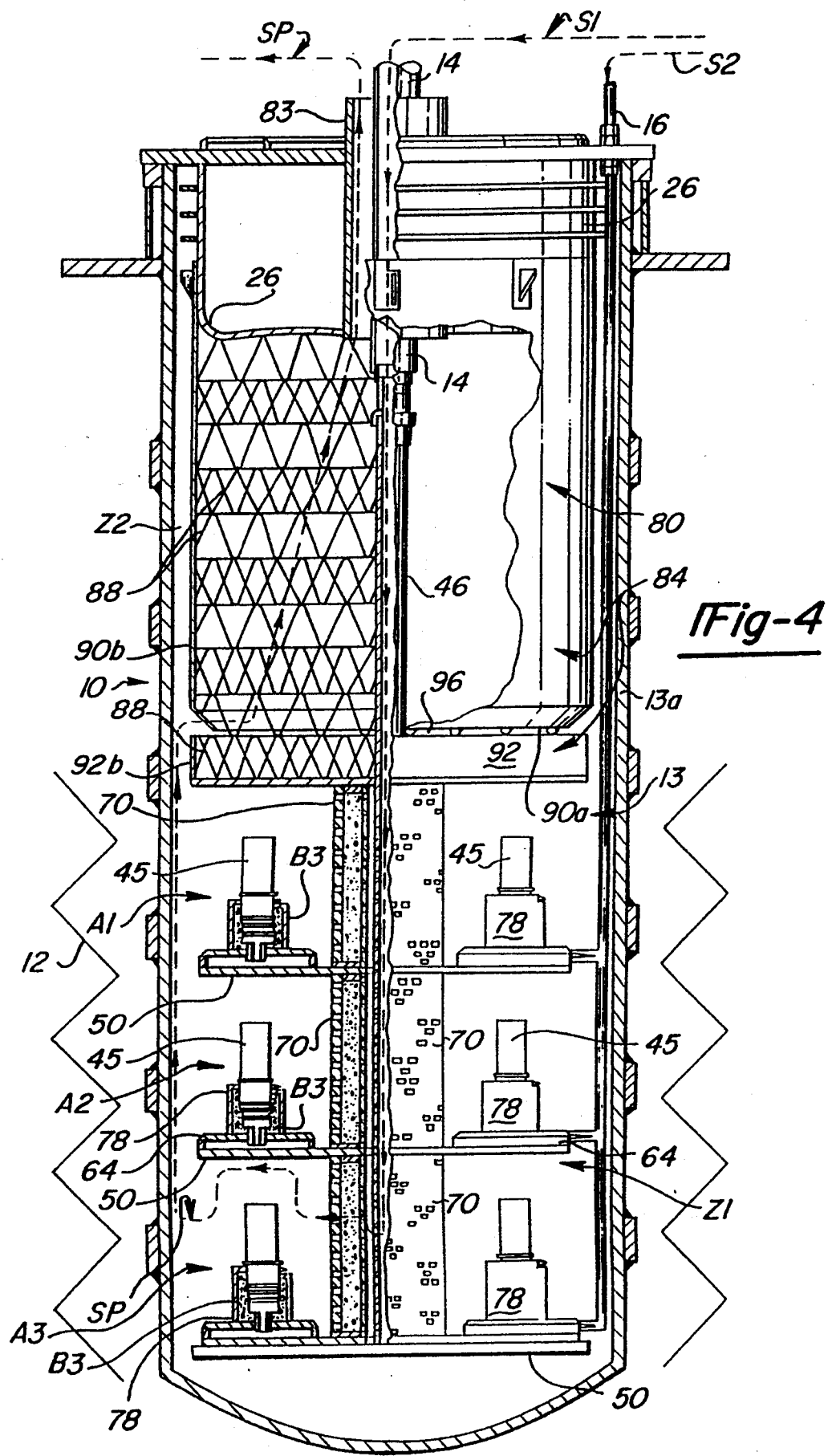
FIG. 4 is a cross-sectional view of the coating apparatus of another embodiment of the invention with some components shown in elevation.

In an alternate exemplary embodiment, the gaseous reactant streams S1,S2 can each comprise an aluminum trifluoride and subfluoride/carrier gas mixture. In this event, the canisters 70 can be omitted, if desired, from around the distribution conduit 46 or left empty as shown in FIG. 4. Similarly, the canisters 72 can be omitted, if desired, such that the stream S2 is supplied directly from the manifolds 64 to the interior of the substrate via the gas tubes 68 as shown for the substrates 45 in FIG. 4. The aluminum trifluoride/subfluoride in the streams S1,S2 reacts with the heated substrate surfaces to form the aforementioned oxidation and corrosion resistant aluminide coating thereon.

As shown in FIGS. 2 and 4, the lowermost portions 45a of the substrates 45 (root portions of turbine blades) are contained or fixtured in a bed B3 of inert filler particulates, such as alumina particulates, and a binder, such as an organic shellac type binder available from Alloy Surfaces Co., Wilmington, Del., contained in a masking/fixturing canister 78 disposed on the canisters 72 as shown in FIG. 2 or directly on the manifolds 64 as shown in FIG. 4. The bed B3 of inert filler particulates and binder functions to hold the substrate in position and to shield the lowermost substrate portions 45a from contact with and coating by the coating gas stream S1. The canisters 78 may comprise a unitary open-ended can or a two part can wherein opposing side sections are fastened together by a pin, etc. about the lowermost portion 45a. Typically, the bed B3 is introduced into each canister 78 after the lowermost substrate portion 45a is located therein. The binder is allowed to harden or cure to form a bonded particulate bed B3 about each lowermost substrate portion 45a in each canister 78.

As a result of the coating reaction that occurs between the coating gas streams S1/S2 and the substrates 45, a spent gas stream SP (illustrated schematically in FIG. 2) is produced in the coating region Z1 and is removed from the reactor chamber 13 via the exhaust region Z2 by action of the aforementioned pump 30 or by the existing flow of streams S1/S2 through the reactor chamber. Since the gaseous reactant streams S1,S2 (coating gas streams) are typically supplied to the coating region Z1 with the reactant (e.g., metal halide gas) present in an excess of the stoichiometric amount required for coating the substrates 45, the spent stream SP typically contains the carrier gas and also excess, unreacted reactant (e.g., metal halide gas such as the aluminum subchlorides or the aluminum trifluorides/subfluorides in the exemplary embodiments described above).

In accordance with one embodiment of the present invention, means 80 is disposed in the exhaust region Z2 for condensing excess, unreacted gaseous reactant from the spent gas stream SP before entry into the heated exhaust outlet conduit 83 (conduit 83 heated to 180° C.), which is disposed concentrically about the conduit 46 in the water-cooled reactor cover 26 and in communication with the pump 30 (or ambient atmosphere) via conduit 85 as shown in FIG. 1. As is apparent, the condensing means 80 is disposed between the coating region Z1 and the exhaust outlet 83.

In accordance with one embodiment of the invention, the condensing means 80 includes an apertured, high surface area condensing structure 82 disposed in the exhaust region Z2 where the temperature of the spent gas stream SP is sufficiently reduced to condense the excess, unreacted gaseous reactant therefrom. A tubular, thermal barrier enclosure 84 is disposed about the condensing structure 82 and configured in a manner to be described to direct the spent gas stream SP from the coating region Z1 to the condensing structure 82 where the excess, unreacted gaseous reactant can flow across its surfaces and condense as a result of the lower temperature thereof.

To this end, the condensing means 80 is located in the exhaust region Z2 where the temperature of the spent gas stream SP will be sufficiently low to effect condensation of the excess, unreacted reactant on the structure 82. In effect, the condensing means 80 functions as a high surface area cold trap for condensing the excess, unreacted reactant from the spent gas stream SP.

For example, in coating nickel base superalloy substrates 45 using the aforementioned aluminum trichloride/carrier gas streams S1,S2 converted to subchlorides of aluminum, the gas temperature in the coating region Z1 typically varies from about 820° C. proximate the upper substrates 45 to about 900° C. proximate the lower substrates 45 as a result of heating of the streams as they flow through the conduits 46,60 in the chamber 13. In contrast, the temperature of the spent gas stream SP in the tubular enclosure 84 varies from about 385° C. proximate the water-cooled reactor cover 26 to about 850° C. proximate the collection member 92. The excess, unreacted aluminum subchlorides in the spent gas stream SP disproportionate and condense at about 660° C. on portions or surfaces of the structure 82 at or below this temperature to form molten and/or solid Al crystals thereon.

On the other hand, when the gas streams S1,S2 comprise aluminum trifluoride/carrier gas, the spent gas stream SP includes excess, unreacted aluminum trifluoride which condenses at about 850° C. on portions or surfaces of the structure 82 at or below this temperature.

Plugging of the reactor exhaust outlet conduit 83 and other downstream exhaust components, such as conduit 85 and pump 30, is thereby avoided.

Figure 3:
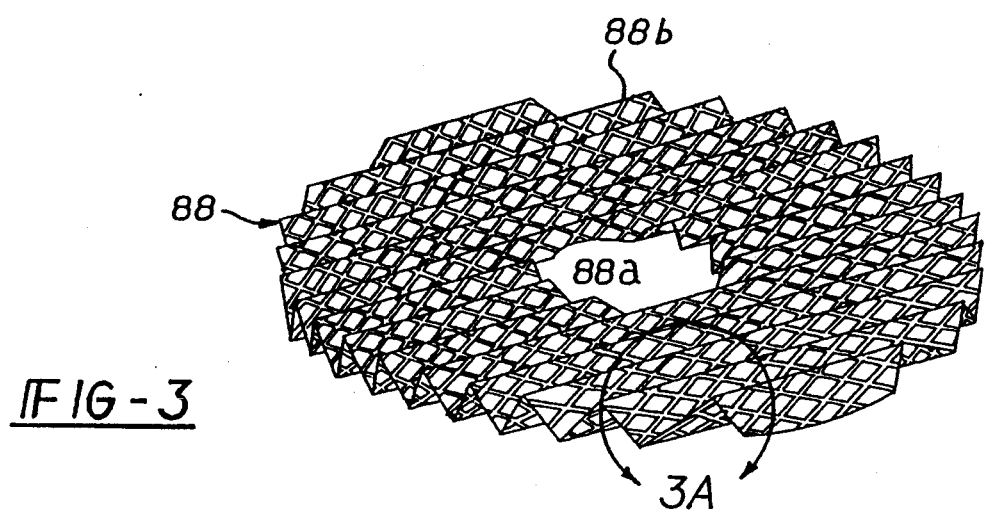
FIG. 3 is a perspective view of a condensing screen.
Figure 3A:
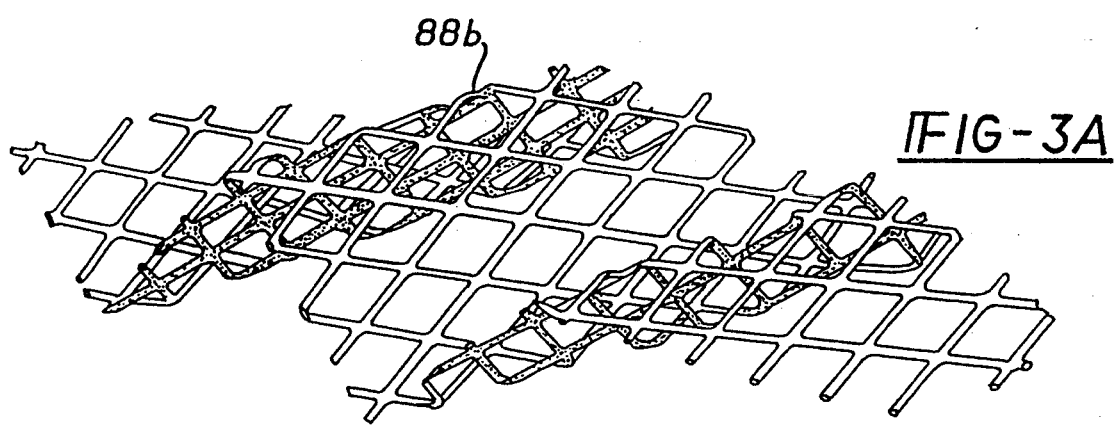
FIG. 3A is a partial perspective view showing details of a condensing screen.

In the embodiment of the invention illustrated in FIG. 2, the apertured condensing structure 82 comprises a plurality of corrugated metal (e.g. Inconel 600) screens 88 stacked atop one another in the tubular enclosure 84. The screens 88 each comprise criss-crossed metal strips welded together where they intersect to form an apertured or perforated screen, FIGS. 3 and 3A. The screens 88 each include a central opening 88a for receiving the distribution conduit 46 extending centrally through the exhaust region Z2. The screens 88 include parallel corrugations 88b as shown best in FIG. 3. The screens 88 are stacked such that the corrugations 88b are oriented perpendicularly to one another from one screen to the next in the stack.

The metal (e.g., Inconel 600) tubular, thermal barrier enclosure 84 comprises an upper tubular member 90 enclosing the stacked screens 88 and having an open lower end 90a and a pan-shaped collection member 92 spaced beneath the stacked screens 88 and tubular member 90 so as to provide a peripheral opening 96 therebetween through which the spent gas stream SP from the coating region Z1 is directed to pass through the screens 88 from proximate the bottom toward the top of the stack of screens 88. The collection member 92 functions to collect any condensed gaseous reactant falling or dripping from the screens 88 thereabove so as to avoid damage to the underlying coated substrates 45.

For example, when the excess, unreacted reactant comprises aluminum subchlorides ($AlCl_2/AlCl$) or aluminum trifluoride, the condensate on the screens 88 comprises aluminum in molten and/or solid crystal forms. The aluminum condensate can fall or drip downwardly from the screens 88 toward the coating region Z1 during a coating cycle. However, the collection member 92 catches and collects the aluminum condensate and prevents contact and resultant damage to the coated substrates 45 therebelow. The collection member 92 also functions as a direct thermal barrier between the coating region Z1 and the exhaust region Z2.

The tubular member 90 and the collection member 92 include respective peripheral side walls 90b,92b closely proximate the outer side wall 13a of the reactor chamber 13 (e.g., a space of ½ inch therebetween) to facilitate direction of the spent gas stream SP from the coating region Z1 into the peripheral opening 96 therebetween.

The enclosure 84 and the screens 88 can be removed periodically from the exhaust region Z2 during shutdown of the reactor 10 (after the reactor cover 26 is removed) for cleaning of the enclosure and the screens to remove the excess, unreacted reactant condensed thereon. For example, when the condensate comprises aluminum, the condensate is removed by an acid (e.g., nitric acid) stripping operation. The stripped or cleaned enclosure 84 and the screens 88 can then be returned to the exhaust region Z2 for reuse.

In another embodiment of the invention illustrated in FIG. 5, the condensing means 80 comprises an internally-cooled apertured condensing structure, such as an internally-cooled coil 87', disposed in the upper tubular member 90 above the pan-shaped collection member 92, both of which function in the same manner as described above for FIG. 2. A cooling gas or fluid, such as argon or helium gas or water, flows through the coil structure 87' via an inlet conduit 87a' and an outlet conduit 87b' to facilitate condensation of the excess, unreacted gaseous reactant thereon. In other respects, the embodiment of FIG. 5 operates in the same manner and includes like components as the embodiment of FIG. 4, which are represented by like reference numerals.

Figure 6:
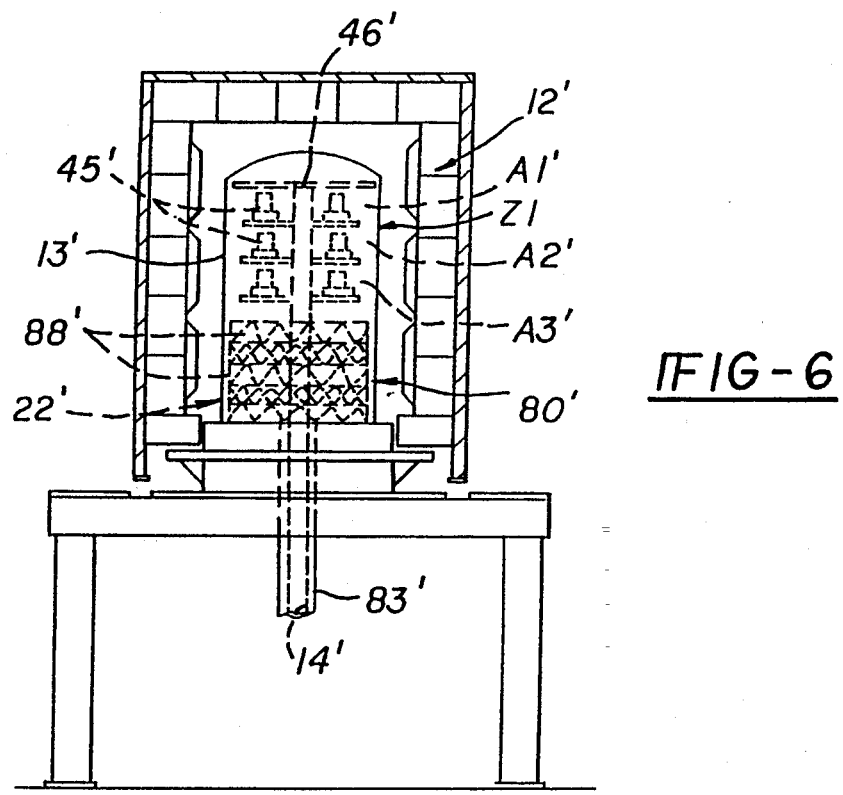
FIG. 6 is a sectioned, side view of a coating apparatus in accordance with a further embodiment of the invention.

FIG. 6 schematically illustrates still another embodiment of the invention differing from those described hereinabove in that the coating region Z1' is disposed in the upper end of the chamber 13' and the exhaust region Z2' is disposed in the lower end of the chamber 13'. The chamber 13' is shown disposed in a removable furnace 12'.

The substrates 45' are supported at coating zones A1',A2',A3' in the coating region Z1' in a similar manner as described above, and gas streams are supplied to the coating zones by a central gas distribution conduit 46' and an optional auxiliary distribution conduit (not shown but similar to conduit 60 in FIGS. 2 and 4). The gas stream(s) flow upwardly through the distribution conduit(s) for discharge at the coating zones A1',A2',A3' for externally and optionally internally coating the substrates. A condensing means 80' comprising a stack of metal screen 88' is disposed in the exhaust region Z2' to remove any excess, unreacted gaseous reactant from the spent gas stream prior to its entering the exhaust outlet 83'. The exhaust outlet 83' is disposed concentrically about the inlet conduit 14'. The inlet conduit 14' communicates with the conduit 46' to supply the gas stream for coating the exterior of the substrates 45'.

Although the invention has been illustrated above using the gaseous reactant streams S1,S2 to independently coat the exterior and interior of the substrates, the invention is not so limited and may be practiced using only one of the streams S1,S2 as desired for a particular coating application. The gaseous reactant streams S1,S2 and spent gas coating stream SP may comprise chemical species other than the aluminum trichloride/subfluorides described hereinabove. For example, chromium halides, hafnium halides, zirconium halides, yttrium halides, etc. may be present in addition to or in lieu of those gaseous reactants described hereinabove and condensed on the condensing means 80 in the reactor chamber 13 prior to entering the exhaust outlet conduit 83.

While the invention has been described in terms of specific embodiments thereof, it is not intended to be limited thereto but rather only to the extent set forth hereafter in the claims which follow.

We claim:

1. A method of chemical vapor deposition, comprising:
   a) supporting a substrate to be coated in a coating region of a reactor chamber,
   b) heating the substrate to an elevated reaction temperature,
   c) introducing a gaseous stream including a gaseous reactant to the coating chamber to react with the heated substrate to form a coating thereon and generate a spent gas stream,
   d) condensing excess, unreacted gaseous reactant present in the spent gas stream onto a condensing structure disposed in an exhaust region of the reactor chamber communicated to the coating region, and
   e) exhausting the spent gas stream from the exhaust region after said spent gas stream contacts the condensing structure.

2. The method of claim 1 including directing the spent gas stream from the coating region through a peripheral opening in a tubular enclosure disposed about the condensing structure.

3. The method of claim 1 including collecting any condensed gaseous reactant falling from the condensing structure on a collection member disposed beneath the tubular enclosure.

4. The method of claim 1 including condensing the excess, unreacted gaseous reactant on a plurality of screens stacked atop one another in the exhaust region.

5. The method of claim 4 including removing the screens from the exhaust region to remove the condensed reactant therefrom and then returning the screens to the exhaust region for reuse.

6. The method of claim 5 including supplying the gaseous reactant stream through an inlet conduit extending through the screens in the exhaust region to the coating region.

7. The method of claim 1 including condensing the excess, unreacted gaseous reactant on an internally cooled structure.

8. The method of claim 7 wherein the excess, unreacted gaseous reactant is collected on an internally-cooled coil structure.

9. A method of chemical vapor depositing an aluminide coating on a substrate, comprising:
   a) supporting a substrate to be coated in a coating region of a reactor chamber,
   b) heating the substrate to an elevated reaction temperature,
   c) introducing a gaseous reactant stream including a gaseous aluminum-bearing reactant to the coating chamber to react with the heated substrate to form an aluminide coating thereon and generate a spent gas stream,
   d) condensing excess, unreacted gaseous aluminum-bearing reactant present in the spent gas stream as aluminum condensate onto a condensing structure located in an exhaust region of the reactor chamber communicated to the coating region where, in the exhaust region, the temperature of the spent gas stream is sufficiently low for condensation of said excess, unreacted gaseous reactant, and
   e) exhausting the spent gas stream from the exhaust region after said spent gas stream contacts the condensing structure.

10. A method of chemical vapor deposition, comprising:
    a) supporting a substrate to be coated in a coating region of a reactor chamber,
    b) heating the substrate to an elevated reaction temperature,
    c) introducing a gaseous stream including a gaseous reactant to the coating chamber to react with the heated substrate to form a coating thereon and generate a spent gas stream,
    d) directing the spent gas stream from the coating region through a peripheral opening in a tubular enclosure disposed about a condensing structure in an exhaust region of the reactor chamber communicated to the coating region,
    e) condensing excess, unreacted gaseous reactant present in the spent gas stream onto the condensing structure, and
    f) exhausting the spent gas stream from the exhaust region after said spent gas stream contacts the condensing structure.

11. The method of claim 10 including collecting condensed gaseous reactant falling from the condensing structure on a collection member disposed beneath the tubular enclosure.

12. A method of chemical vapor deposition, comprising:
    a) supporting a substrate to be coated in a coating region of a reactor chamber,
    b) heating the substrate to an elevated reaction temperature, c) introducing a gaseous stream including a gaseous reactant to the coating chamber to react with the heated substrate to form a coating thereon and generate a spent gas stream, d) condensing excess, unreacted gaseous reactant present in the spent gas stream onto a plurality of condensing screens stacked atop one another in an exhaust region of the reactor chamber communicated to the coating region, and e) exhausting the spent gas stream from the exhaust region after said spent gas stream contacts the condensing structure.

13. The method of claim 12 including removing the screens from the exhaust region to remove the condensed reactant therefrom and then returning the screens to the exhaust region for reuse.

14. The method of claim 12 including supplying the gaseous reactant stream through an inlet conduit extending through the screens in the exhaust region to the coating region.

15. A method of chemical vapor deposition, comprising:

a) supporting a substrate to be coated in a coating region of a reactor chamber, b) heating the substrate to an elevated reaction temperature, c) introducing a gaseous stream including a gaseous reactant to the coating chamber to react with the heated substrate to form a coating thereon and generate a spent gas stream, d) condensing excess, unreacted gaseous reactant present in the spent gas stream on an internally-cooled coil structure disposed in an exhaust region of the reactor chamber communicated to the coating region, and e) exhausting the spent gas stream from the exhaust region after said spent gas stream contacts the condensing structure.

* * * * *